(12) United States Patent
Hirohata et al.

(10) Patent No.: US 7,653,510 B2
(45) Date of Patent: Jan. 26, 2010

(54) LOAD CALCULATING DEVICE AND LOAD CALCULATING METHOD

(75) Inventors: Kenji Hirohata, Tokyo (JP); Minoru Mukai, Tokyo (JP); Katsumi Hisano, Matsudo (JP); Takashi Kawakami, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/056,020

(22) Filed: Mar. 26, 2008

(65) Prior Publication Data

US 2008/0249743 A1      Oct. 9, 2008

(30) Foreign Application Priority Data

Mar. 27, 2007   (JP)   ............... 2007-081687

(51) Int. Cl.
  *G06F 17/18*   (2006.01)
(52) U.S. Cl. .................. 702/181; 702/118; 714/47; 714/E11.193; 374/E7.042
(58) Field of Classification Search ............. 702/118, 702/132, 181–182, 186; 714/47–48, 746–797, 714/E11.193, E11.195; 374/E7.042
See application file for complete search history.

(56) References Cited

U.S. PATENT DOCUMENTS

| | | | | |
|---|---|---|---|---|
| 3,541,445 | A | * | 11/1970 | Taylor et al. ............... 324/99 R |
| 6,075,880 | A | * | 6/2000 | Kollhof et al. ............... 382/141 |
| 6,480,809 | B1 | | 11/2002 | Slaight |
| 6,789,049 | B2 | | 9/2004 | Gross et al. |
| 6,950,773 | B1 | | 9/2005 | Gross et al. |
| 6,975,944 | B1 | * | 12/2005 | Zenhausern ................. 702/22 |

FOREIGN PATENT DOCUMENTS

JP         07-311028         11/1995

OTHER PUBLICATIONS

Kishimoto et al., 'A Printed Circuit Board (PCB) Inspection System Employing the Multi-Lighting Optical System', 1990, IEEE Publicaiton, pp. 120-129.*

(Continued)

*Primary Examiner*—Edward Raymond
*Assistant Examiner*—Elias Desta
(74) *Attorney, Agent, or Firm*—Finnegan, Henderson, Farabow, Garrett & Dunner, L.L.P.

(57) ABSTRACT

A device and method for providing a load calculating device is presented. In one embodiment, a load calculating device can include a variable acquiring unit configured to acquire monitoring variables. The monitoring variables can include in a detected value by a sensor monitoring a state of a circuit board and a performance characteristic obtained by a tool monitoring performance of the circuit board. The device can also store a first statistical model that is one of a regression model, an occurrence frequency distribution and a probability distribution; a second storage configured to store a second statistical model that is one of a regression model, an occurrence frequency distribution and a probability distribution. An arithmetic processor can then be used to calculate the intermediate variable from the monitoring variables according to the first statistical model and calculate the physical quantity from calculated intermediate variable according to the second statistical model.

14 Claims, 10 Drawing Sheets

OTHER PUBLICATIONS

Matsumoto et al., "Hierarchical Bayes Model and Related Matters," Iwanami Shoten (2004), pp. v-vi.

Usu et al., "Collected Papers of the Japan Society for Mechanical Engineers," vol. 44, No. 386, (1978), pp. 3322-3332.

Endo et al., "Damage Evaluation of Metals for Random or Varying Loading—Three Aspects of Rain Flow Method," Proc. 1974 Symp. on Mechanical Behavior of Material, (1974), pp. 371-381.

Japanese Patent Application 2007-081687 Official Action issued Aug. 25, 2009 (3 pages).

* cited by examiner

LOAD CALCULATING DEVICE AND LOAD CALCULATING METHOD

CROSS REFERENCE TO RELATED APPLICATIONS

This application is based upon and claims the benefit of priority from the prior Japanese Patent Applications No. 2007-81687, filed on Mar. 27, 2007; the entire contents of which are incorporated herein by reference.

BACKGROUND OF THE INVENTION

1. Field of the Invention

The present invention relates to a load calculating device and a load calculating method which estimate a physical quantity relating to a failure phenomenon at least one place on an circuit board located in an electronic apparatus while the electronic apparatus is in operation, to execute a load calculation or fault diagnosis on the circuit board on the basis of the estimated physical quantity.

2. Related Art

Electronic apparatuses may be subjected to loads resulting from physical or chemical effects associated with a manufacture, test, or use environment. An electronics circuit board in the electronic apparatus may thus be damaged depending on the design thereof. For the electronics circuit board, it is expected that in response to demands for reduced size and thickness, improved performance, and multifunctionality, elements will be three-dimensionally mounted in the circuit board, components will be built into the circuit board, signals of greater capacities will be transmitted at higher speeds, and the elements generate a greater quantity of heat. Thus, the electronics circuit board may be at a higher risk for possible failures such as thermal fatigue damage to solder junctions, inappropriate insulation resulting from electromigration or whisker, element cracks, damage to micro-junctions, swelling or stripping of resin, and damage to wiring. Further, users' various purposes of utilization of the electronics circuit board further increase the uncertainty of the estimation of loads, which is important in reliability design. In the reliability design, the estimation of the load in a field (user specifications) is important in correctly understanding acceleration factors for reliability test conditions for field (user specification) conditions. However, for digital information apparatuses, users have various purposes of utilization, so that in more and more cases, the conventional estimation conditions for the field load fail to correspond to reality. Thus, a new method for reasonably calculating the field load is required. It is also important to inform the user of load history or a performance degradation condition while the apparatus is in use or when the apparatus is found faulty because this gives the user a feeling of security.

The failure phenomenon estimation problem involves a tradeoff between a plurality of failure modes and is complicatedly associated with a large number of parameters. It is thus difficult to determine how to deal with the problem only on the basis of local examinations. This is likely to result in the following ad-hoc determinations or actions without sufficient analysis of data structures; "the factors should be subjected to regressive analysis", "the high correlation coefficient is expected to indicate a strong association", "the average should to be taken in order to eliminate variations", "this factor may have an impact and should thus be slightly weighted", or "the physical quantity for a particular place should be used as a performance index". For individual problems that have been sufficiently verified by failure phenomenon analysis, such an itemized design method often leads to high-performance processes owing to calibration data accumulated for many years. Further, such quick, responsive guidelines are important in a chaotic time of foundation. However, failure estimating methods or reliability designing methods overly adapted to the individual problems are often readily affected by a variation in circumstances or conditions. Furthermore, such a method has difficulty dealing quickly with new problems, possibly reducing general efficiency. It is thus important to provide uniform formulation for parts independent of the specialty of the problem as well as design guidelines for load and reliability modeling.

Related documents include Proc. 1974 Symp. on Mechanical Behavior of Material (T. Endo et al. (1974), pp. 371), Collected Papers of the Japan Society for Mechanical Engineers (Ippei USU, Hiroyuki OKAMURA, A, Vol. 44, No. 386, (1978), pp. 3322), and Hierarchical Bayes Model and Related Matters (Takashi MATSUMOTO, Makio ISHIGURO, Toshiro INUI, Kunishi TANABE, Iwanami Shoten, 2004).

SUMMARY OF THE INVENTION

According to an aspect of the present invention, there is provided with a load calculating device comprising:

a variable acquiring unit configured to acquire, as monitoring variables, a detected value by a sensor monitoring a state of a circuit board and a performance characteristic obtained by a tool monitoring performance of the circuit board, wherein one or more electronic components are mounted on the circuit board;

a first storage configured to store a first statistical model that is one of
    a regression model determining an intermediate variable from the monitoring variables,
    an occurrence frequency distribution relating to the monitoring variables and the intermediate variable, and
    a probability distribution relating to the monitoring variables and the intermediate variable;

a second storage configured to store, for at least one place on the circuit board, a second statistical model that is one of
    a regression model determining a physical quantity from the intermediate variable,
    an occurrence frequency distribution relating to the intermediate variable and the physical quantity, and
    a probability distribution relating to the intermediate variable and the physical quantity; and an arithmetic processor configured to calculate the intermediate variable from the monitoring variables acquired by the variable acquiring unit according to the first statistical model and calculate the physical quantity on the at least one place from calculated intermediate variable according to the second statistical model.

According to an aspect of the present invention, there is provided with a load calculating method comprising:

acquiring, as monitoring variables, a detected value by a sensor monitoring a state of a circuit board and a performance characteristic obtained by a tool monitoring performance of the circuit board, wherein one or more electronic components are mounted on the circuit board;

reading out a first statistical model that is one of
    a regression model determining an intermediate variable from the monitoring variables,
    an occurrence frequency distribution relating to the monitoring variables and the intermediate variable, and
    a probability distribution relating to the monitoring variables and the intermediate variable;

calculating the intermediate variable from acquired monitoring variables according to the first statistical model reading out, for at least one place on the circuit board, a second statistical model that is one of a regression model determining a physical quantity from the intermediate variable, an occurrence frequency distribution relating to the intermediate variable and the physical quantity, and a probability distribution relating to the intermediate variable and the physical quantity; and calculating the physical quantity on the at least one place from calculated intermediate variable according to the second statistical model.

DETAILED DESCRIPTION OF THE INVENTION

Figure 1:
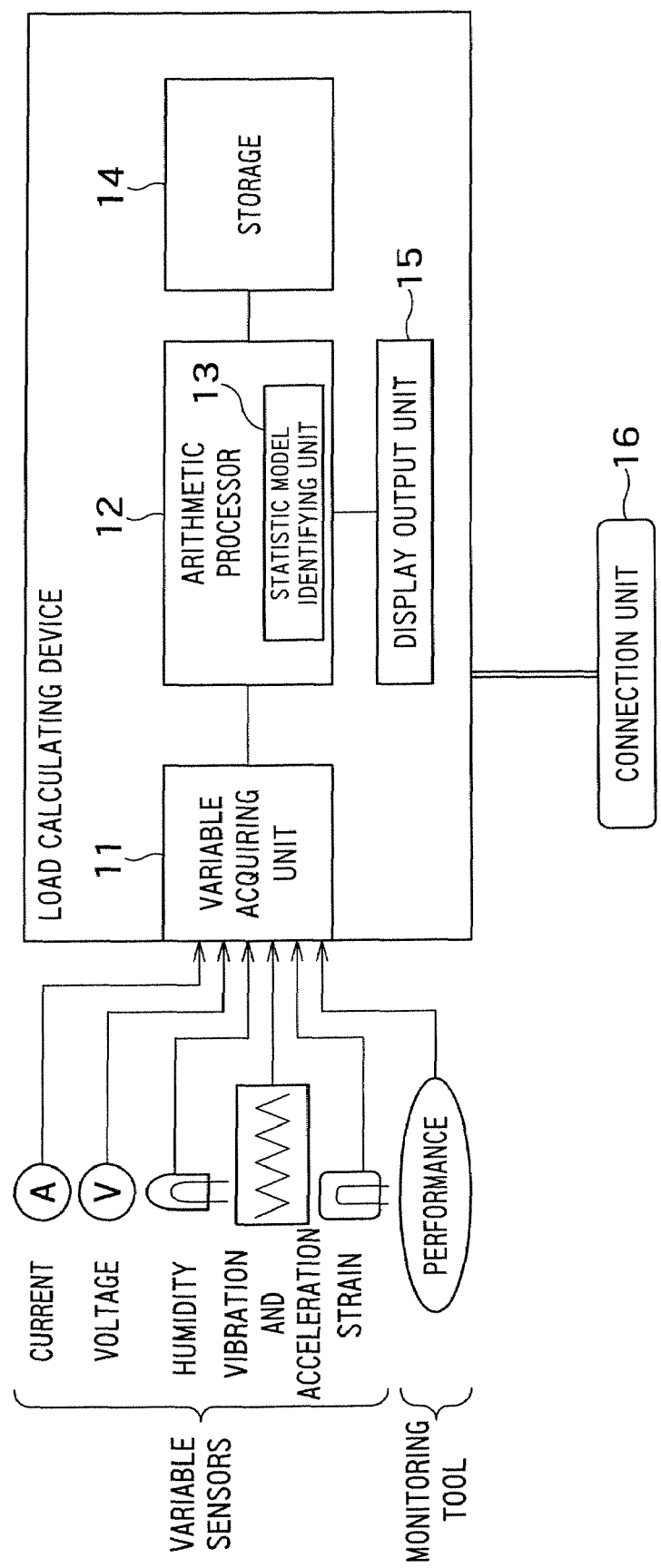
FIG. 1 is a diagram showing a configuration of a load calculating device as an embodiment of the present invention.

With reference to the drawings, description will be given of a load calculating device in accordance with an embodiment of the present invention. FIG. 1 shows the load calculating device in accordance with an embodiment of the present invention.

The load calculating device estimates a certain physical quantity (the time, space, and frequency distributions of the physical quantity) relating to a failure phenomenon for at least one place on an electronics circuit board built into an electronic apparatus such as a notebook personal computer. The load calculating device further determines the occurrence probability distribution of a failure mode (for example, a heat dissipation degradation occurrence probability distribution, a junction fatigue occurrence probability distribution, or an inappropriate insulation occurrence probability distribution) on the basis of the estimated distribution of the physical quantity or predicts the life expectancy distribution of the electronics circuit board on the basis of a reliability model.

The electronics mounted circuit includes at least one electronic component. The electronic component may include devices, for example, a CPU (Central Processing Unit) and a memory device, as well as a housing for the devices and a cooling structure such as a cooling fan. The distribution of the physical quantity estimated by the load calculating device is, for example, a temperature distribution, a deformation distribution, a strain distribution, a stress distribution, a load distribution, a pressure distribution, a humidity distribution, a voltage distribution, a current distribution, an electromagnetic field distribution, an acceleration distribution, a flow rate distribution, a heat transfer coefficient distribution, a heat flux distribution, or an environment distribution.

To estimate the distribution of the physical quantity, a variable acquiring unit 11 acquires, as monitoring variables, detected values from sensors (for example, sensors embedded in the electronics circuit board or sensors built into an electronic apparatus including the electronics circuit board) that monitor the electronics circuit board for the condition thereof, and the performance characteristic of the electronics circuit board acquired by a profiling tool or a monitoring tool which communicates with a Bios (Basic input/output system) and the like. The performance characteristic of the electronics circuit board includes the performance characteristic of the components such as the CPU and memory device, the circuit board, the cooling structure, and the housing, as well as a performance characteristic such as a signal transmission characteristic or noise characteristic among the components or a heat dissipation characteristic between the cooling structure including the housing and a semiconductor package. The variable acquiring unit 11 may acquire not only the monitoring variables but also design variables (for example, the structure, arrangement, material characteristics, and size of the electronics circuit board, and boundary conditions for and variation information on the electronics circuit board). Values for the design variables are pre-stored in a storage 14.

The detected value from the sensors is for, for example, current, voltage, vibration, acceleration, or strain. The sensors are arranged, for example, at a small number of sample points on the electronics circuit board. The performance characteristic is, for example, use frequency, element performance, fan rotation speed, battery remaining charge, or an element load factor. An arithmetic processor 12 in the load calculating device uses these data (and the design variables) as inputs and also uses a prepared hierarchical statistical model (first and second statistical models) to estimate the time, space, and frequency distributions of the physical quantity for at least one place on the electronics circuit board.

Specifically, the at least one place on the electronics circuit board is at least one place (at least one of the frames (elements) into which a sectional area is divided or the nodes of the frames) in a cross section of the electronics circuit board including the CPU and memory device which cross section is taken at any height of the circuit board along a line parallel to a surface of the circuit board. The first and second statistical models are identified (estimated) by a statistical model identifying unit (statistical model estimating unit) 13 and stored in the storage 14.

Data or the like (for example, the distribution of the physical quantity, the occurrence probability distribution of the failure mode, or life expectancy prediction results) estimated by the load calculating device can be displayed on a screen of a display (load display device) by a display output unit 15 of the load calculating device. FIGS. 2(A) to (E) show examples of the connection between the load calculating device and the load display device and the electronics circuit board. The load calculating device has a connecting unit 16 for connection to another device.

Figure 2:
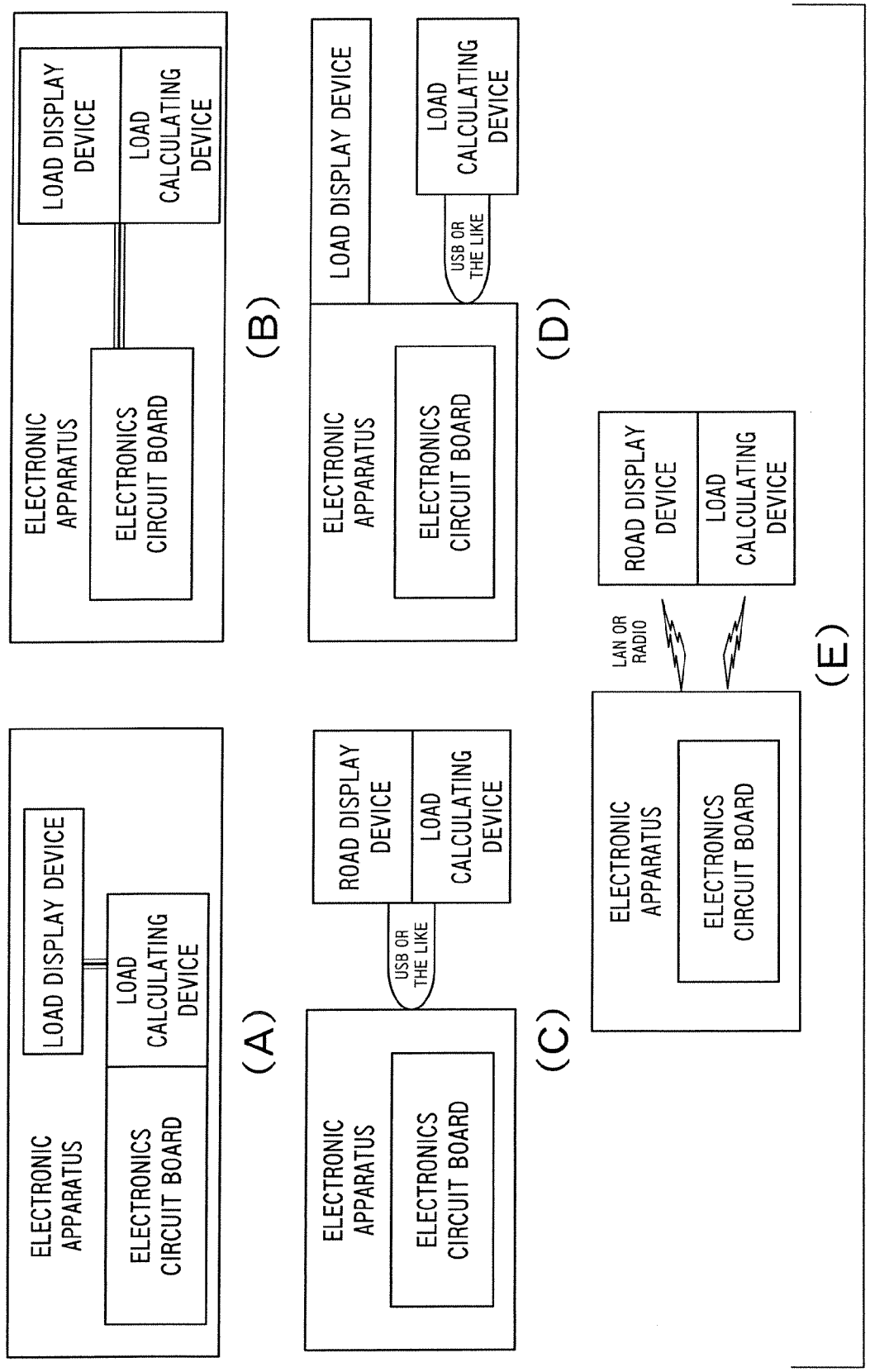
FIG. 2 is a diagram showing an example of forms in which the load calculating device is connected to an electronics circuit board.

In FIG. 2(A), a device (for example, a DSP (Digital Signal Processor)) having an embedded program embedded therein is mounted (wiring board connection) on the electronics circuit board included in the electronic apparatus such as a notebook personal computer, as a load calculating device. The load calculating device is connected to the load display device (for example, a display in the notebook personal computer) by wire.

In FIG. 2(B), the load calculating device is present as a storage (saving device) such as a hard disk in which programs are stored. The programs are read and executed by the CPU, included in the electronics circuit board. The load display device and the load calculating device are each connected to the electronics circuit board by wire.

In FIG. 2(C), the load display device and the load calculating device are each connected to the electronics circuit board via a plug-in kit such as a USB. The load calculating device is, for example, a storage in which programs are stored. The programs are read and executed by the CPU provided on the electronics circuit board.

In FIG. 2(D), of the load calculating device and the load display device, only the load calculating device is connected to the electronics circuit board in the electronic apparatus via the plug-in kit. The load display device is connected to the electronics circuit board by wire. The load calculating device is, for example, a storage in which programs are stored. The programs are read and executed by the CPU provided on the electronics circuit board.

In FIG. 2(E), the load calculating device and the load display device are connected to the electronics circuit board in the electronic apparatus via a network such as a radio LAN (Local Area Network) or a wired LAN. The load calculating device is present as a server apparatus including the CPU, memory device. The load calculating device acquires and processes the monitoring variables from the electronics circuit board. The load calculating device and the load display device are connected together, and the load display device displays data obtained from the load calculating device.

Figure 3:
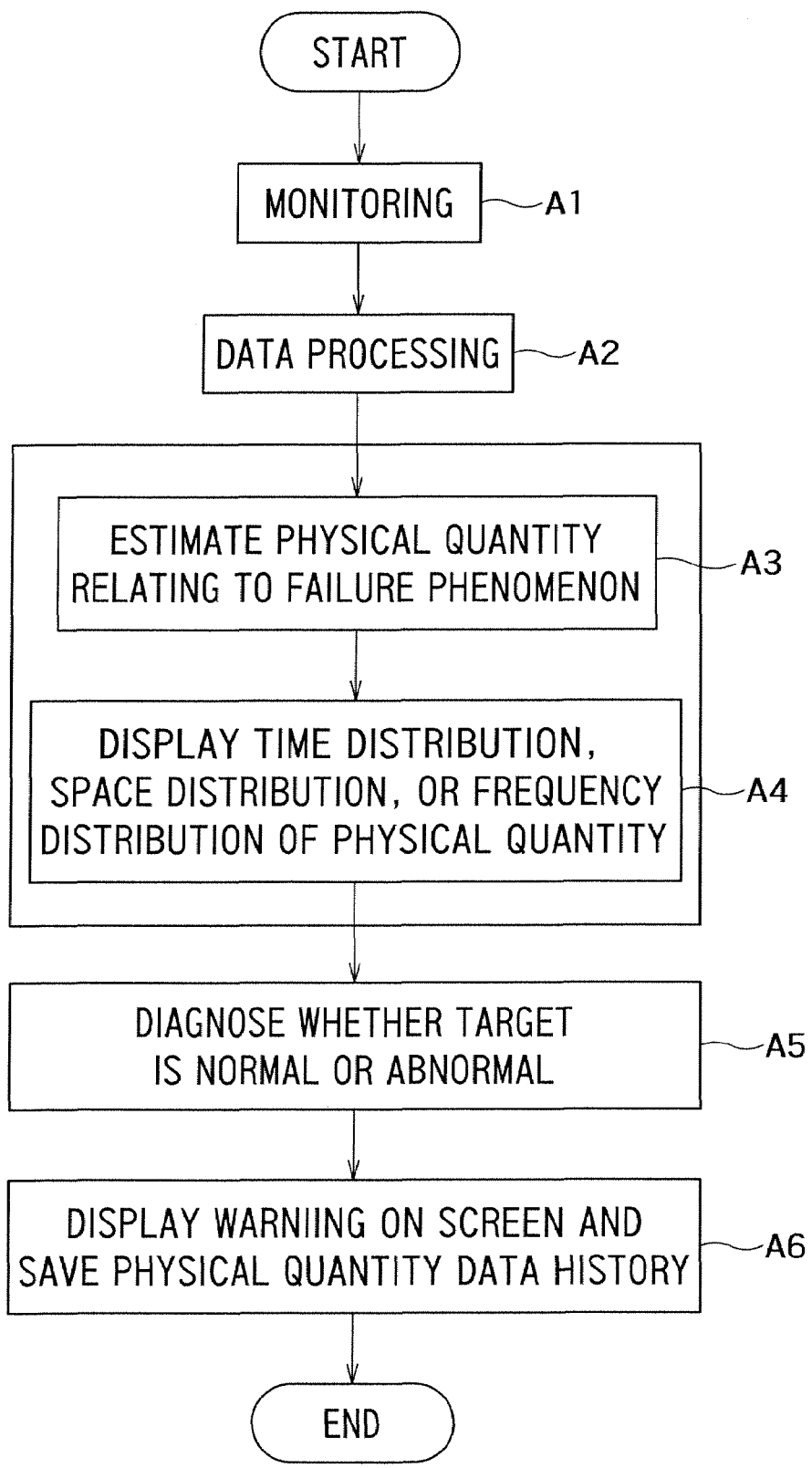
FIG. 3 is a flowchart showing the flow of health monitoring using the load calculating device.

FIG. 3 schematically shows the flow of an example of a process (health monitoring) executed by the load calculating device.

The variable acquiring unit 11 of the load calculating device acquires the monitoring variables from the sensors and monitoring tool (A1) and executes a preprocess (for example, noise removal or calculation of a moving average corresponding to a transient response) on the monitoring variables (A2).

The arithmetic processor 12 in the load calculating device determines a load corresponding to a load mode from the monitoring variables (or monitoring variables and design variables) (A3). More specifically, the load calculating device includes a load model (including a first statistical model and a second statistical model) used to estimate the physical quantity for at least one place on the circuit board and to calculate the load corresponding to the failure mode from the physical quantity. The load model is provided with the monitoring variables (or monitoring variables and design variables) to determine the load corresponding to the failure mode.

Figure 7:
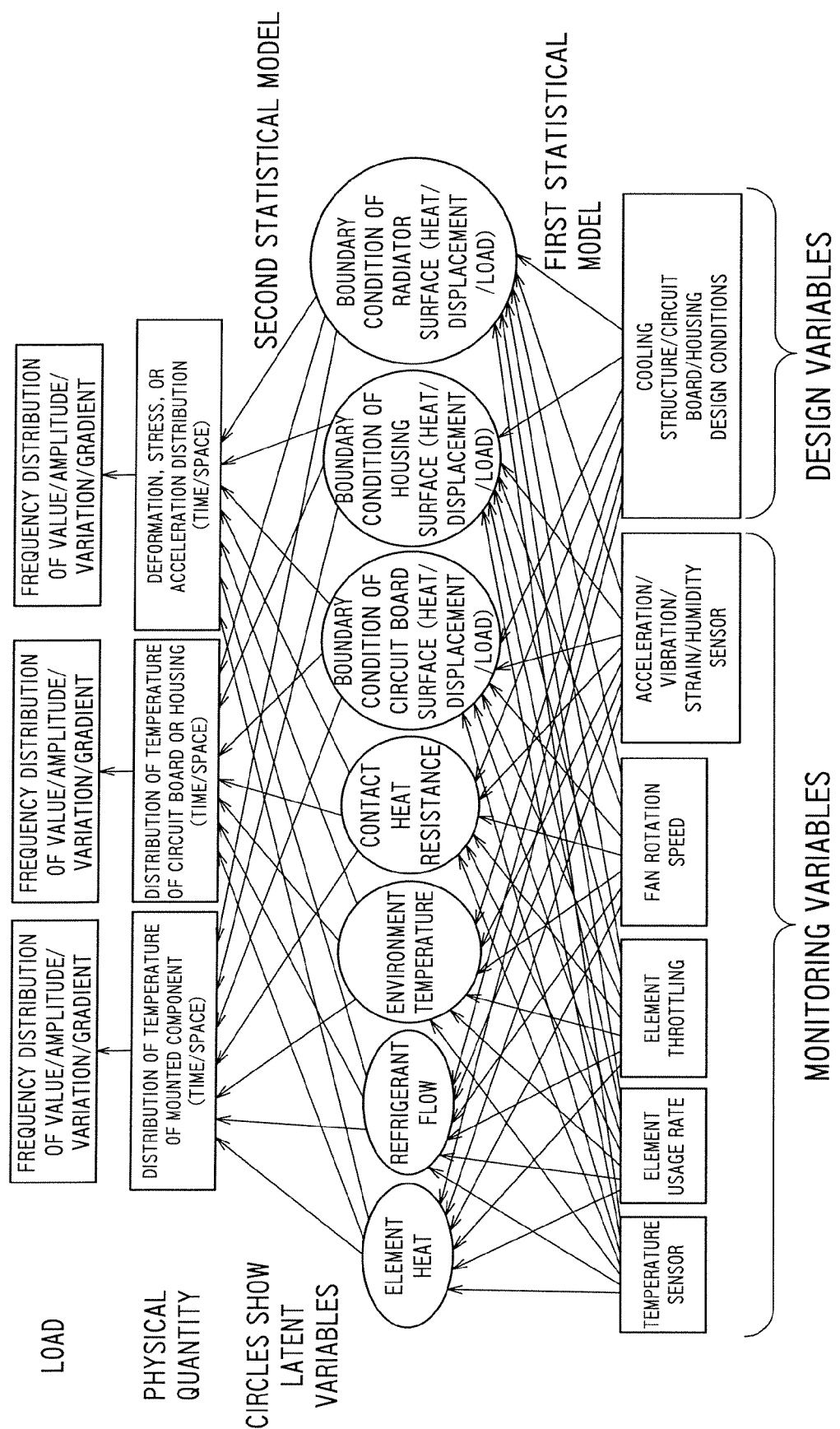
FIG. 7 is a diagram showing an example showing an example of specifications for a load model.

FIG. 7 shows an example of specifications for the load model. The load model assumes fatigue of a solder junction as a failure mode. The load model includes the first statistical model (multivariate regression model, multivariate frequency distribution, or multivariate probability distribution) relating to the monitoring variables (and design variables) and intermediate variables (latent variables) and a second statistical model (multivariate regression model, multivariate frequency distribution, or multivariate probability distribution) relating to the intermediate variables (latent variables) and the physical quantity. The intermediate variables (latent variables) cannot be or are not monitored but significantly affect the physical quantity. The intermediate variables are known by a designer. The intermediate variables are also called the latent variables, which will be used throughout the following description. As described above, the first and second statistical models are identified by the statistical identifying unit (statistical model estimating unit) 13 and stored in the storage 14. Description will be given later of a method for estimating the first statistical model and the second statistical model (identifying method).

In FIG. 7, the arithmetic processor 12 in the load calculating device first determines the latent variables (element heat, refrigerant flow rate, environment temperature, contact heat resistance, . . . ) from the monitoring variables (temperature sensor value, element utilization factor, element throttling, fan rotation speed, or acceleration, vibration, strain, or temperature sensor value) and the design variables on the basis of the first statistical model. The first statistical model is a regression model determining the latent variables from the monitoring variables (and design variables), or an occurrence frequency distribution (for example, the occurrence frequency distribution prepared for each latent variable) relating to the monitoring variables (and design variables) and the latent variable, or a probability frequency distribution (for example, the probability distribution prepared for each latent variable) relating to the monitoring variables (and design variables) and the latent variable. The occurrence frequency distribution includes the form of a cumulative frequency distribution. The probability distribution may be a probability density distribution or a cumulative probability distribution.

Then, the arithmetic processor 12 in the load calculating device determines the time distribution and space distribution (mounted component temperature distribution, circuit board and housing temperature distribution, or deformation, stress, or acceleration distribution) of the physical quantity from the latent variables on the basis of the second statistical model. The second statistical model is a regression model determining the physical quantity for at least one place on the electronics circuit board from the latent variable, an occurrence frequency distribution (for example, the occurrence frequency distribution prepared for each physical quantity type) relating to the latent variables and physical quantity for the at least one place, or a probability frequency distribution (for example, the probability distribution prepared for each physical quantity type) relating to the latent variables and physical quantity for the at least one place. The occurrence frequency distribution includes the form of a cumulative frequency distribution. The probability distribution may be a probability density distribution or a cumulative probability distribution.

Then, the arithmetic processor 12 in the load calculating device determines a load on a time dependent failure phenomenon or a load on a static failure phenomenon from the estimated time distribution (time series data) and space distribution of the physical quantity for the at least one place on the electronics circuit board. Examples of the time dependent failure phenomenon (a failure resulting from a repeated load) include fatigue damage, electrochemical migration, and corrosion. A typical example of the static failure phenomenon is a failure mode which is caused by a heavy load such as deformation, strain, or impact and which completes in a short time. For example, determination is made of the frequency distribution (load frequency distribution) of an index indicating the load for the failure occurrence resulting from the repeated load, for example, fatigue damage to a solder junction. For example, depending on the load mode, determination is made of at least one of the loads including the occurrence frequency of the physical quantity, an occurrence frequency relating to the amplitude of the physical quantity, an occurrence frequency relating to the gradient of the physical quantity, and an occurrence frequency relating to the coefficient of variation for the physical quantity. In addition, for the load on the static failure phenomenon, a load indicating a maximum load distribution based on an extreme statistical model may be determined.

Figure 4:
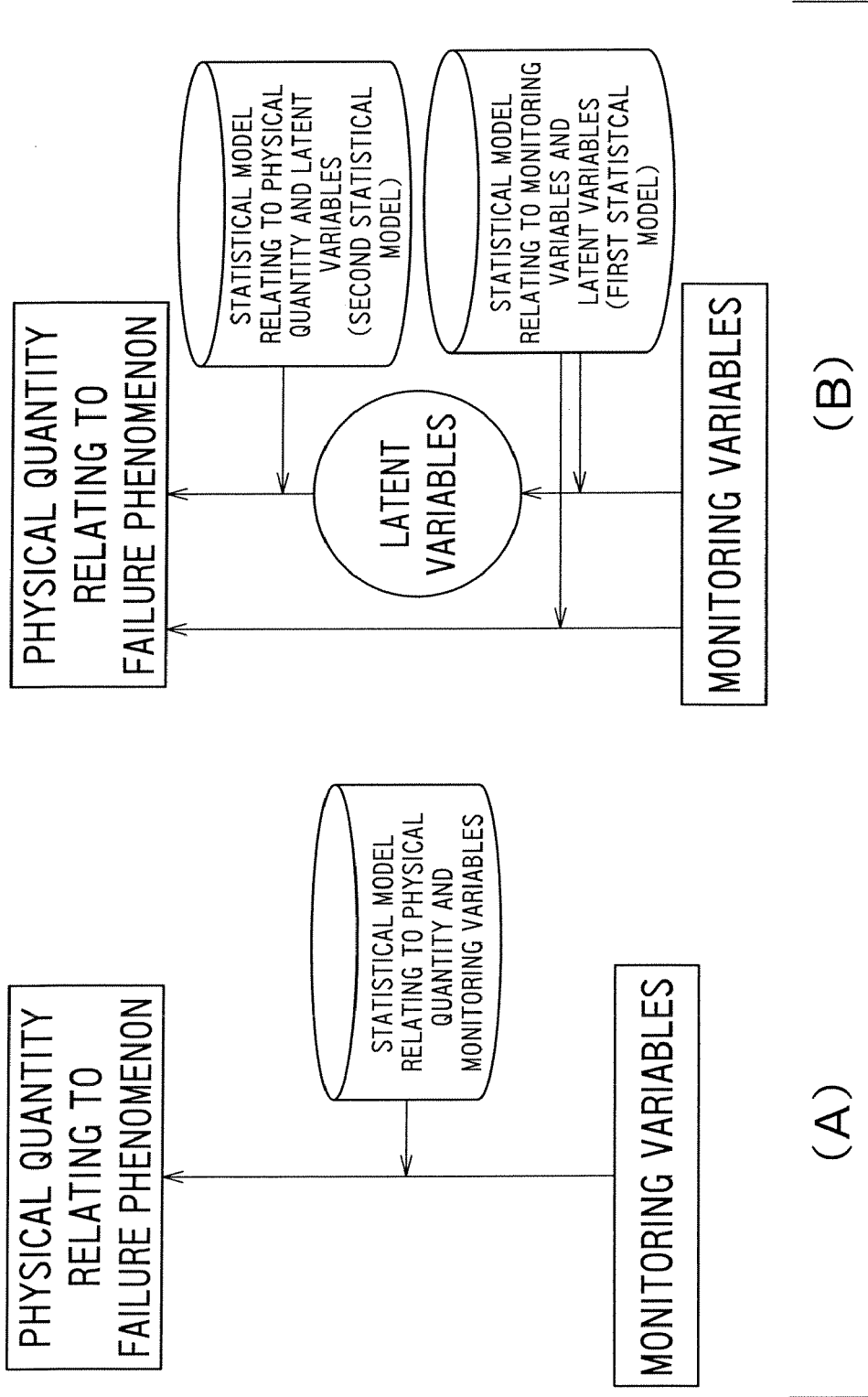
FIG. 4 is a diagram illustrating differences between the present invention and a conventional example.

Thus, the present embodiment is characterized by preparing the first and second statistical models and determining the physical quantity and load from the monitoring variables via the latent variables. As shown in FIG. 4(A), the conventional art prepares a statistical model relating to the physical quantity and the monitoring variables and determines the physical quantity directly from the monitoring variables. However, the conventional art is considered to be often ineffective in that for example, excessively marked errors may result from the proper determination of the physical quantity for all the places or at least one place on the circuit board from the monitoring variables obtained from limited places on the circuit board. In contrast, as shown in FIG. 4(B), the present embodiment prepares the latent variables effective for determining the physical quantity on the circuit board and determines the physical quantity from the monitoring variables via the latent variables. This allows the physical quantity for any place on the circuit board to be efficiently determined even from monitoring variables obtained from the limited places on the circuit board.

Referring back to FIG. 3, the display output unit 15 in the load calculating device displays the estimated distribution of the physical quantity (the time distribution or space distribution of the physical quantity) on the screen of the load calculating device and also displays the frequency distribution of the physical quantity (the frequency distribution of the load) on the same screen (A4). For example, the display output unit 15 sequentially displays the space distribution of the physical quantity in time series (chronological order) and also displays the frequency distribution of the physical quantity (the frequency distribution of the load) on the screen while sequentially updating the frequency distribution.

Then, the arithmetic processor 12 in the load calculating device determines the occurrence probability distribution of the failure mode or the like from the estimated distribution of the physical quantity (the load corresponding to the failure mode) on the basis of the prepared reliability model. The arithmetic processor 12 then diagnoses the electronics circuit board (prediction of life expectancy or failure occurrence probability) on the basis of the determined occurrence probability distribution and a prepared diagnosis model (Mahalanobis distance or Bayes' multiple testing hypothesis) (A5). The display output unit 15 displays diagnosis results on the screen of the load display device (A6), and if for example, the electronics circuit board is found abnormal, displays a warning screen. The arithmetic processor 12 further saves the distribution of the physical quantity (time, space, or frequency distribution) sequentially obtained to the storage 14 (A6).

Figure 8:
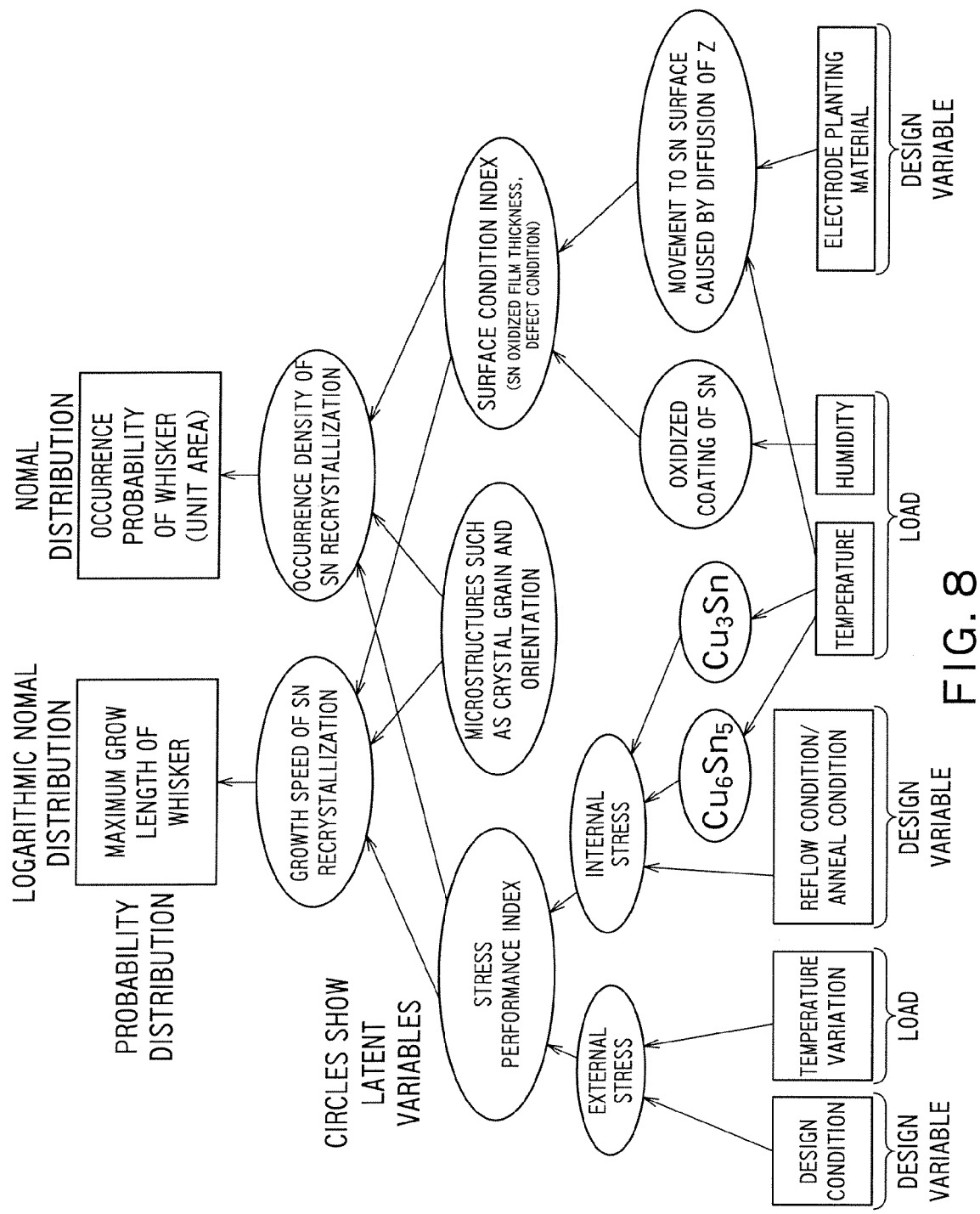
FIG. 8 is a diagram showing an example of specifications for a reliability model.
Figure 9:
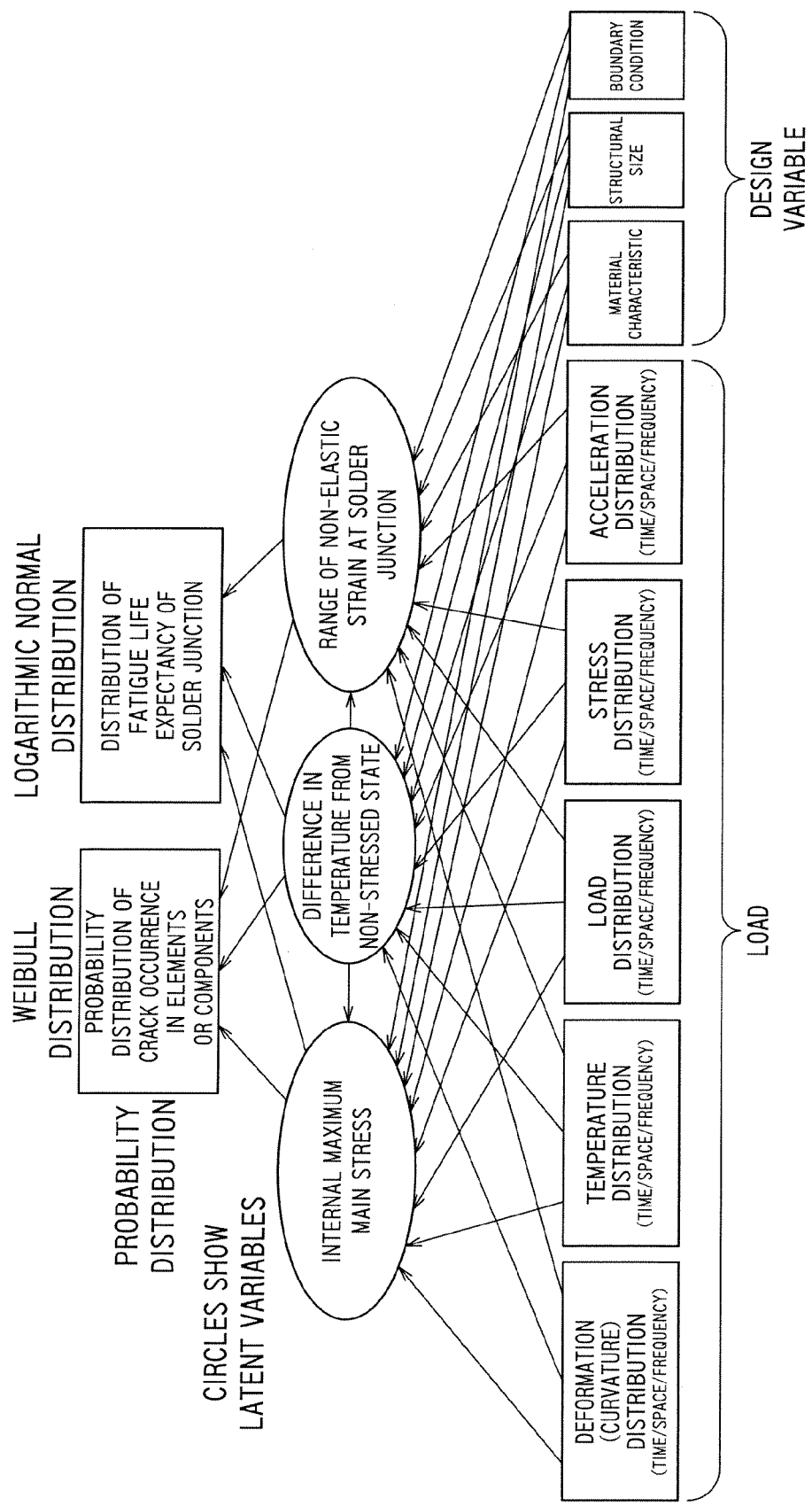
FIG. 9 is a diagram showing another example of the specifications for the reliability model.
Figure 10:
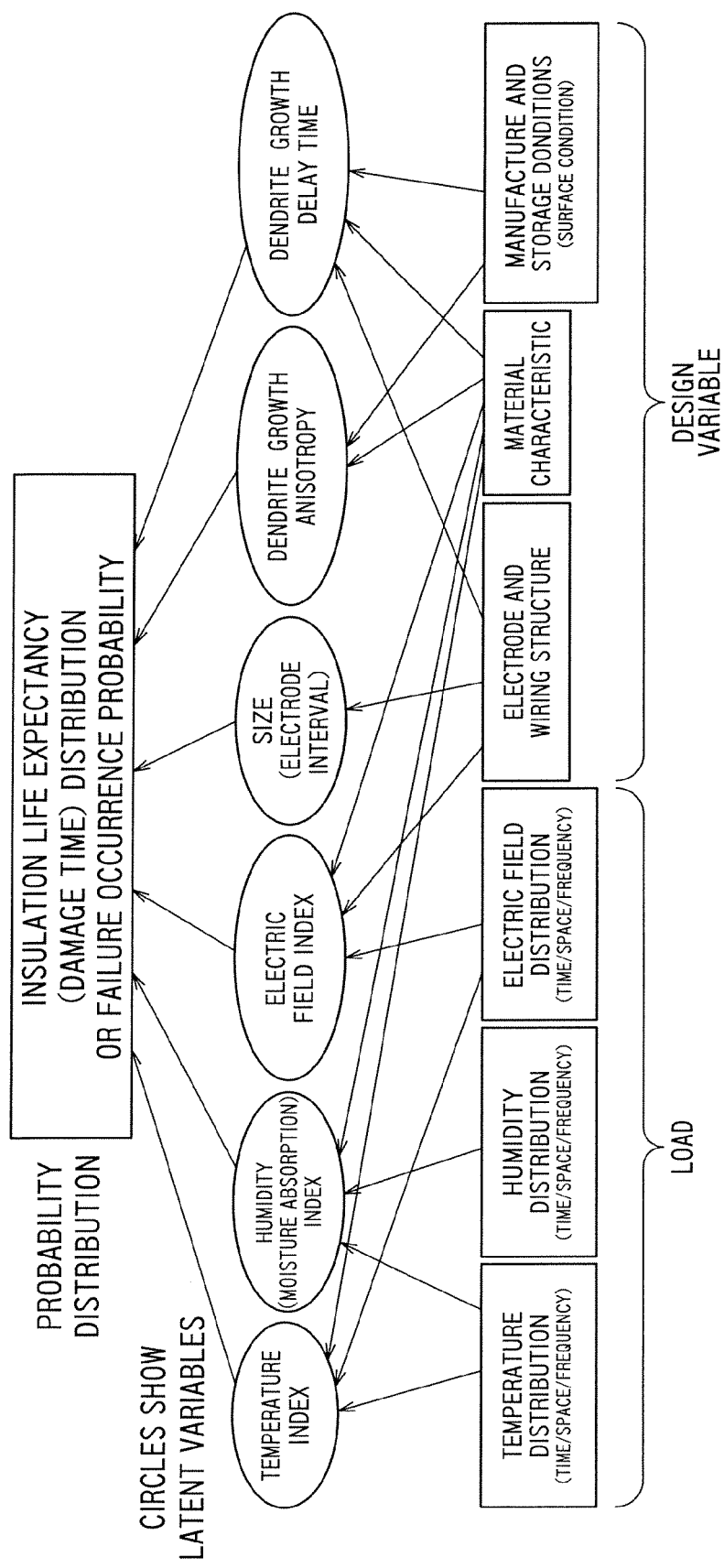
FIG. 10 is a diagram showing yet another example of the specifications for the reliability model.

FIGS. 8 to 10 show an example of specifications for reliability models.

FIG. 8 shows an example of a reliability model for the case in which the failure mode is inappropriate insulation (whisker). Design conditions, reflow conditions or anneal conditions, and an electrode plating material correspond to the design variables. Temperature variation, temperature, and humidity correspond to the distribution of the physical quantity (the load on the inappropriate insulation). The probability distribution of the index for the inappropriate insulation (whisker) is determined from the distribution of the physical quantity and the design variables via a plurality of latent variables (it should be noted that these latent variables are different from the latent variables for the load model). The electronics circuit board can be diagnosed (prediction of the life expectancy or failure occurrence probability) on the basis of the probability distribution and the diagnosis model (Mahalanobis distance or Bayes' multiple testing hypothesis).

FIG. 9 shows an example of a reliability model for the case in which the failure mode is a crack or fatigue damage. FIG. 10 shows an example of a reliability model for the case in which the failure mode is the inappropriate insulation (electrochemical migration).

Figure 5:
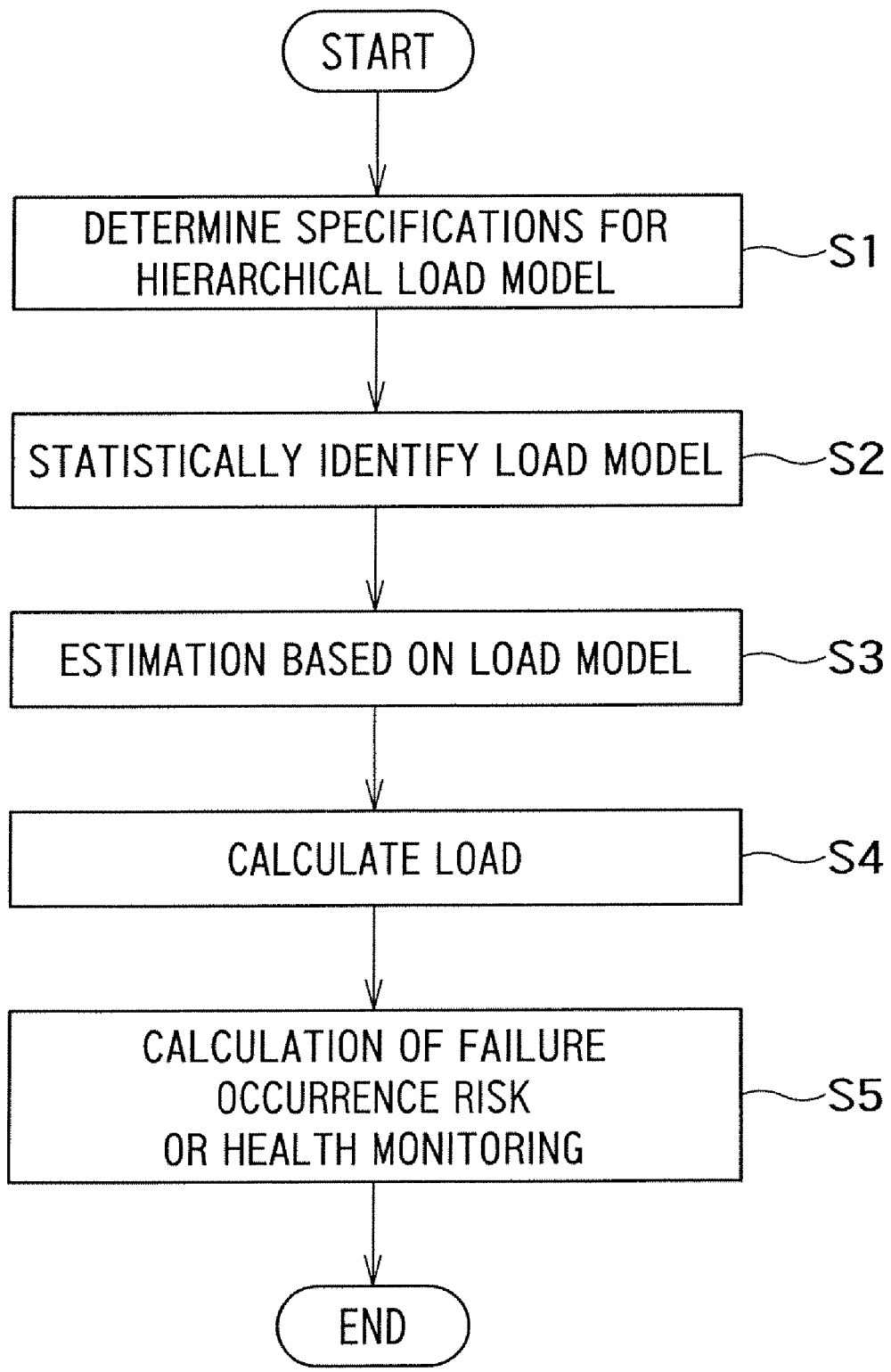
FIG. 5 is a flowchart showing the flow of processing executed by the load calculating device.

FIG. 5 is a flowchart illustrating in detail the basic flow of a process executed by the load calculating device in FIG. 1.

The flow of the present process is roughly divided into determination of specifications for a hierarchical load model (step S1), statistical identification of the load model (step S2), estimation based on the load model (step S3), calculation of the load (step S4), and calculation of a failure occurrence risk or health monitoring. The processing in each step may be carried out by allowing a computer to execute a program describing a group of operation codes instructing the processing in each step to be executed.

The specific procedure of each step will be shown below.

First, step S1 will be described. In step S1, specifications for the load model are determined (specifications for the statistical model are determined). The present step is roughly divided into [1] to [3] described below.

Figure 6:
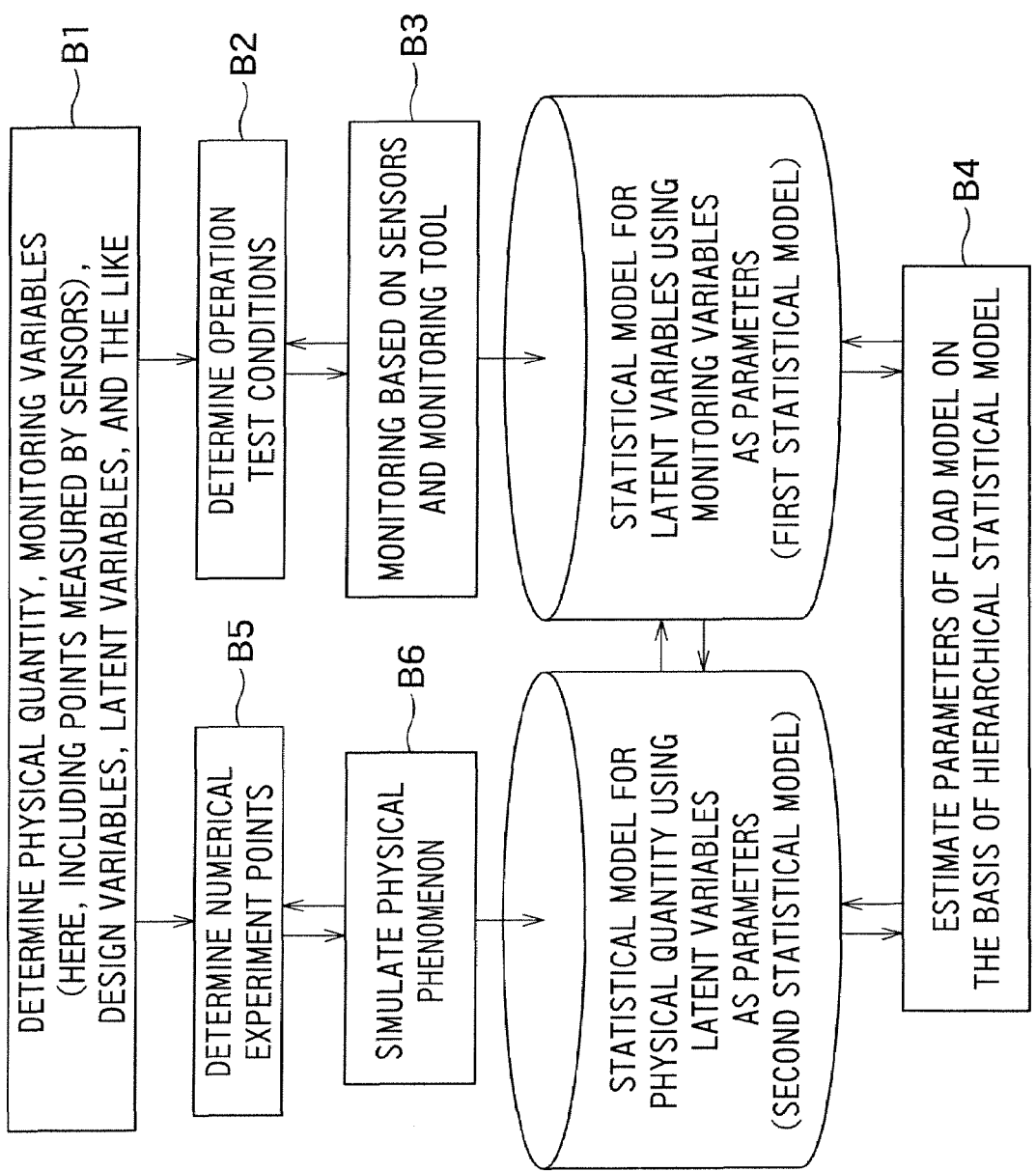
FIG. 6 is a diagram illustrating the flow of processing in steps S1 and S2 in FIG. 5.

[1] As shown in FIG. 6 illustrating the flow of the processing in steps S1 and S2, first, the monitoring variables, prediction variable (physical quantity), latent variables, and design variables (design conditions) are set for the electronics circuit board (B1).

Possible monitoring variables include a CPU load factor, a fan voltage (which relates to the fan rotation speed), a GPU load factor, voltage used, current used, a LCD luminance, memory usage, and HDD usage.

Possible latent variables include a CPU heat, a GPU heat, a ChipSet heat, a CPU contact heat resistance, a GPU contact heat resistance, a heat transfer coefficient for a heat spreader surface, a thermal boundary condition for a mounted circuit board boundary (peripheral temperature distribution), and an environment temperature.

Possible prediction variables (physical quantities) include a circuit board temperature, a semiconductor package temperature, a heat spreader temperature, mounted components, and circuit board strain.

[2] Specifications (the degree of and an interaction item for the regression model, the type of the occurrence frequency distribution, and the type of the probability distribution) for the statistical model between the prediction variable and the latent variables and the pre-distribution type (occurrence frequency distribution type or probability distribution type) of the latent variables are set.

[3] Specifications (the degree of and an interaction item for the regression model, the type of the occurrence frequency distribution, and the type of the probability distribution type) for the statistical model between the latent variables and the monitoring variables (and design variables) are set.

Now, step S2 will be described. In step S2, the load model is statistically identified. The present step is roughly divided into [11] to [16] described below.

[11] Setting operation test conditions for the target electronics circuit board (B2 in FIG. 6)

Monitoring timings for apparatus startup, a steady state, and the like are set.

Further, an operation environment during operation is set. For example, the following are set: the element load factor, the fan rotation speed (and a relation for the element temperature), the element temperature, the environment temperature, boundary conditions for the surroundings of the apparatus (for example, the apparatus is placed on a cushion), the conditions under which the mounted circuit board and the cooling structure are fixed (radiator compression load and the like), an ODD write and read state, a memory usage rate, and a battery usage rate. That is, the performance of the apparatus and the conditions for the sensor monitoring target are forcibly set.

Specific possible examples of the operation test conditions are as follows:

Use form: the apparatus is fixed in a room or is mobile. The apparatus is connected to an AC adapter or operated by batteries.

Use place: the apparatus is placed on a desk (no objection in front of a fan air hole) or on a cushion (the fan air hole is blocked with the cushion).

Monitoring variable: a variation in CPU load factor or a variation in fan voltage (the fan voltage relates to the fan rotation speed)

Prediction variable: the circuit board temperature, semiconductor package temperature, heat spreader temperature, mounted components, or circuit board strain

[12] Setting the pre-distribution of the latent variables and the design variables On the basis of information on the uncertainty of the latent variables and the design variables, the probability distribution type and distribution parameter relating to the latent variables and the design variables are determined. A uniform distribution may be used if no information is available.

[13] Setting the type of the second statistical model by means of Monte Carlo simulation based on physical phenomenon analysis (B5 and B6 in FIG. 6)

Description will be given of a method for setting the type of the second statistical model on the basis of a response surface model (regression model) relating to the physical quantity using the latent variables as parameters.

The electronics circuit board and the peripheral structure thereof are divided into elements (lattice).

Numerical experiment points (combinations of the design variables and the latent variables) are determined by an experimental design method (B5). Thermal analysis and heat distortion analysis are executed on each numerical experiment point (B6). It is assumed that a physical phenomenon model (for example, a heat distortion phenomenon) used in simulation utilizing CAE has been identified.

On the basis of the results of the thermal analysis and the heat distortion analysis, the response surface model (regression model) relating to the latent variables (in some cases, including some of the design variables) is calculated for the physical quantity (the temperature, the amount of deformation of the circuit board, or the like) for target nodes (frames resulting from the element division).

Input variables (latent variables and design variables) for the response surface model are subjected to Monte Carlo simulation (including a bootstrap technique) to calculate a data set of the latent variables and the physical quantity. The input variables for the response surface model conform to the probability distribution parameter (pre-distribution) set in [12].

A variable space is made discrete, and the occurrence frequency distribution relating to the latent variables and the physical quantity is calculated. The second statistical model is set on the basis of the calculated occurrence frequency distribution.

[14] Acquiring monitoring data under the operation test conditions and signal processing (B3 in FIG. 6)

The monitoring variables and the design variables as well as the physical quantity for at least one place on the circuit board are acquired in real time. The data set acquired is temporarily saved.

The data acquired is separated into temporal variations in target variables, variations depending on the environment and an operation history state, and noise. The total of the temporal variations in target variables and the variations depending on the environment and the operation history state is used for the subsequent processing. For example, the hierarchical Bayes model may be used as a method for removing noise. For the details of the hierarchical Bayes model, see, for example, Hierarchical Bayes Model and Related Matters (Takashi MATSUMOTO, Makio ISHIGURO, Toshiro INUI, Kunishi TANABE, Iwanami Shoten, 2004).

[15] Identifying the second statistical model (B4 in FIG. 6)

For example, the hierarchical Bayes model is used to calculate post-distributions expressing the uncertainty of the latent variables and the design variables, from the monitoring data acquired during operation in [14], the pre-distribution of the latent variables and the design variables determined in [12], and the type of the second statistical model set in [13] (the post-distribution is calculated for each latent variable and for each design variable). Then, statistics such as modes or average values are determined from the post-distributions of the latent variables and the design variables. The determined statistics are defined as parameters of the second statistical model. This allows the second statistical model to be identified. However, for some of the latent variables or some of the design variables, the post-distributions may be used as parameters of the second statistical model as it is (when the second statistical model is the occurrence frequency distribution or the probability distribution). To identify the second statistical model, the bootstrap technique, a maximum likelihood method, MAP estimation, an EM algorithm, or the like may also be used.

[16] For each assumed operation condition, [14] and [15] are repeated to acquire a data set on the monitoring variables, the design variables, and the latent variables.

[17] On the basis of the data set on the monitoring variables, design variables, and latent variables acquired in [16], the first statistical model (regression model, occurrence frequency distribution, or probability distribution) is statistically identified (B4). For example, the type of the first statistical model is predetermined, and the parameters of the first statistical model are determined from the data set to identify the first statistical model. Here, the regression model may include not only a classic multivariate regression model but also a constitutive equation model, a graphical model, and a neural network.

Now, step S3 will be described. In step S3, estimation using the load model and display of estimation results are carried out. The present step is roughly divided into [21] to [24] described below.

[21] The monitoring variables, for example, the CPU load factor and fan voltage observed while the notebook PC is in operation, are acquired from the Bios (Basic input/output system) communication tool (monitoring tool). The monitoring variables are also acquired from the sensors.

Here, instead of being obtained from the sensors or the monitoring tool, the monitoring variable may be an index (certain variable) obtained from the physical quantity for a certain place on the circuit board. More specifically, the arithmetic processor may mathematically pre-locate a specific place on the circuit board at which the physical quantity (for example, temperature) varies most insignificantly in response to a variation in latent variable (for example, CPU load factor) so as to determine the monitoring variable (certain variable) from the physical quantity for the located place and the fourth statistical model (for example, a predetermined value is added to the physical quantity for the located place to determine the certain variable). Here, the fourth statistical model is a regression model determining the certain variable from the physical quantity, an occurrence frequency distribution relating to the physical quantity and the certain variable, or a probability distribution relating to the physical quantity and the certain variable. The fourth statistical model is stored in, for example, the storage.

[22] The first statistical model between the monitoring variable and the design variable and the latent variable is used to sequentially calculate the value of the latent variable from the monitoring variables obtained in [21] and the design variables. The monitoring variable may be a value corresponding to the moving average relating to the past history of time series data as described below. Here, if the first statistical model is the regression model, the value of the latent variable is obtained by inputting the monitoring variable to the regression model. If the first statistical model is the occurrence frequency distribution or the probability distribution, for example, the occurrence frequency distribution or the probability distribution is converted into a cumulative probability distribution. A data set on the latent variable is then obtained by the Monte Carlo method as an empirical distribution. With the occurrence frequency distribution, the statistic of the data set obtained such as the average value, mode, or 50% point thereof is obtained as an output value (the value of the latent variable) from the first statistical model. With the probability distribution, the statistic of the data set obtained (that is, the probability distribution) such as the average value, mode, or 50% point thereof is obtained as an output value (the value of the latent variable) from the first statistical model.

[23] The second statistical model between the latent variable and the physical quantity is used to estimate the physical quantity (for example, temperature and warpage amount) for each place on the circuit board from the latent variable calculated in [22]. If the second statistical model is the regression model, the physical quantity is obtained by inputting the latent variable to the regression model. If the second statistical model is the occurrence frequency distribution, the occurrence frequency distribution is converted into a cumulative probability distribution. A data set on the physical quantity is then obtained by the Monte Carlo method as an empirical distribution. The statistic of the data set obtained such as the average value, mode, or 50% point thereof is obtained as an output value (the value of the latent variable) from the second statistical model. If the second statistical model is the probability distribution, the data distribution (probability distribution) of the physical quantity is obtained by maximum post-distribution estimation (MAP estimation) for the hierarchical Bayes model. The statistic of the data set obtained (probability distribution) such as the average value, mode, or 50% point thereof is obtained as an output value (the value of the latent variable) from the second statistical model. If the second statistical model is the probability distribution, the value of the latent variable may be acquired using the Monte Carlo method as is the case with the occurrence frequency distribution.

[24] The physical quantity data calculated in [23] is displayed (contour diagram, tachometer, or the like). That is, [21] to [23] are repeated to sequentially estimate and display the distribution of the physical quantity (for example, a temperature distribution and a warpage distribution).

Here, for estimation of the physical quantity distribution such as the temperature distribution or heat distortion distribution as well as contour display, the statistical model should be identified also taking a transient change into account (for example, if the operation test is carried out with the element load factor fixed at 20 to 100%, a change in element load factor from 20 to 100% is taken into account). However, by assuming that the physical quantity distribution in the steady state can be used to equivalently express a transient physical quantity distribution on the basis of the moving average of the past history of the time series data on the monitoring variable, a parameter relating to the moving average method (the average of weighting for history time) may be tuned on the basis of a transient response variation in measured data (the sensor value and physical quantity during the operation test).

Further, in estimating the physical quantity in [23], every time the physical quantity for at least one place on the circuit board is determined, the physical quantity for a place different from the at least one place may be estimated. That is, the physical quantity is estimated for an important place (node) on the circuit board so that the physical quantity can be obtained for a different place (node) by estimation from the physical quantity obtained for the important place. For example, a surface of the circuit board at a certain height is divided into a plurality of frames so that the physical quantity can be estimated for important frames as described above, while the physical quantity can be estimated for other unimportant frames by interpolation. This will be described below in detail.

It is assumed that the electronics circuit board is divided into elements (lattice) and that a temporal variation in the physical quantity such as the temperature or deformation amount is estimated for all or some of the nodes. Observation data such as the temperature or deformation amount of each node is represented as "y". When the temperature distribution or warpage distribution is expressed by "y=f(x)", this problem corresponds to estimation of the form (third statistical model) of "f" from the observation data. Here, "x" denotes a position vector and resolution is pre-specified. The problem is simplified into the one-dimensional problem "fi=f(5i)". Description will be given of estimation of "$\{f1, f2, \ldots, f_{5n}\}$" from "fi" (i=1, 2, 3, . . . n). With "$y_i=f_{5i}+r_i$", the problem corresponds to estimation of the value of "5n $\{y1, y2, \ldots, y_{5n}\}$" from "n" data "$\{y1, y2, \ldots, y_n\}$". Noise "ri" to "N(0, $\sigma^2$)" is assumed to be an independent random variable, and the probability density function for a Gaussian distribution is denoted by "$\phi$". Then, the probability density function (third statistical model type) for the entire data can be expressed as follows:

$$P(y \mid f; \sigma^2) = \prod_{i=1}^{n} \phi(y_i \mid f_{5i}; \sigma^2)$$

$$y = (y1, y2, \ldots, y_n)^T$$

$$f = (f1, f2, \ldots, f_{5n})^T$$

On the other hand, the Bayes formula indicates the relationship between the joint distribution and marginal distribution and conditional probability distribution of two random variables as shown below. It is assumed that a distribution "$P(x|\theta)$" depending on the parameter "$\theta$" and the distribution "$P(\theta)$" of "$\theta$" have been given. In this case, the joint distribution "$P(x, \theta)$" is expressed by:

$$P(x, \theta) = P(x|\theta)\pi(\theta).$$

The joint distribution "$P(x, \theta)$" can also be expressed by:

$$P(x) = P(x, \theta)d\theta$$

$$\pi(\theta|x) = P(x, \theta)/P(x)$$

$$\pi(\theta|x)P(x)=P(x,\theta)$$

$$P(x|\theta)\pi(\theta)=\pi(\theta|x)P(x)$$

where "$\pi(\theta)$" is called the pre-distribution of the parameter "$\theta$".

The above formulae enable "P(x)" and "$\pi(\theta|x)$" to be calculated. This indicates that the pre-distribution "$\pi(\theta)$" is modified by the factor "$P(x|\theta)/P(x)$" to obtain the post-distribution "$\pi(\theta|x)$". This means that determining the joint distribution of the two random variables allows one of the distributions to be estimated when the other is observed.

A problem with the estimation is the method for setting the pre-distribution. Accordingly, the pre-distribution "$\pi$" may be composed of pre-information in (1) or (2) described below.

(1) CAE phenomenon analysis for each combination (numerical experiment point) of latent variables and Monte Carlo simulation within the range of the uncertainty of the parameter "$\alpha$" are utilized to obtain the occurrence frequency distribution "$\pi$", constituting the pre-distribution of "$f_i$".

(2) The following is assumed for an area of f in which the distribution is smooth.

$$\pi(f|w^2, f_0, f_{-1}) = \prod_{j=1}^{5n} \frac{1}{\sqrt{2\pi w^2}} \exp\left\{-\frac{(f_j - 2f_{j-1} + f_{j-2})^2}{2w^2}\right\}$$

This is the assumption that the sequence of 2-stage differences for "$\{f_i\}$" is white noise, meaning that three points on a two-dimensional plane lie almost linearly.

An example of the estimating method will be described below.

Description will be given of the case in which a pre-distribution with the smooth distribution of "y" is used. Applying the Bayes' formula to the set of the pre-distribution and the data distribution model (third statistical model) enables the following expression.

$$P(y|f;\sigma^2)\pi(f|w^2,f_0,f_{-1})=\pi(f|y;\sigma^2,w^2,f_0,f_{-1})P(y|\sigma^2,w^2,f_2,f_{-1})$$

The value of f which maximizes "$\pi(f|y)$" is defined as a MAP (Maximum A Posteriori) estimation value, that is, the estimated value for the physical quantity obtained from the third statistical model.

Supplement 1: Method for Determining a Hyper Parameter

If the pre-distribution depends on a hyper parameter, the joint distribution "$P(y,\theta|w)$" also depends on the hyper parameter. By formally considering this to be a model for the distribution of the data "$(y, \theta)$", it is possible to observe the "$(y, \theta)$" to estimate the parameter "w" by the maximum likelihood method. For missing values, the joint distribution defined for the space of "$(y, \theta)$" is integrated in the direction of a "$\theta$" axis to determine the marginal distribution. With the form of "$P(y|w)$", the application of the maximum likelihood method determines "w". The hyper parameter w may be determined by minimizing an ABIC index. Here, the ABIC is a model performance index defined by:

$$\text{ABIC}=-2\times\log\left[\int P(y,\theta|w)d\theta+2\times(\dim\text{ of }w)\right]$$

Supplement 2: MAP Estimation

The distribution of the observed value "y" estimated on the basis of the data "x" is denoted by "P(y|x)". The goodness of "P(y|x)" can be evaluated by the magnitude of the average logarithmic likelihood "$\int Q(y)\log P(y|x)dy$". "Q(y)" denotes the generally unknown true distribution of the random variable "Y". A model with a higher average logarithmic likelihood is expected to more properly approximate the true distribution. This reference is called an information amount reference. In view of the information amount reference, it is possible to determine whether or not the distribution averaged using the post-distribution is optimum.

It is assumed that the generation mechanism "Q(x)" for the data "x" (and "y") can be written by the function "$P(x|\theta)$". It is further assumed that the distribution "$\pi(\theta)$" of "$\theta$" is known.

In this case, the mixed distribution "$\int P(y|\theta)\pi(\theta|x)d\theta$" obtained under the weight of the post-distribution determined by the Bayes' formula is the optimum predictive distribution for the case in which the data x is observed. "$P(y|\theta(x))$" having the estimated value of "$\theta(x)$" as a parameter value is an approximate predictive distribution. The estimated value $\theta(x)$ corresponds to the MAP estimation value.

Now, step S4 will be described. In step S4, load calculation is carried out.

For the load calculation, the required information depends on the failure mode. Structure reliability engineering often deals with a static failure mode and a time-dependent failure mode. A typical example of the static failure mode is a failure mode caused by a heavy load such as deformation or an impact and completing in a short time. Examples of the time-dependent (including a repeated load) failure mode include fatigue damage, electrochemical migration, and corrosion. For statistical load calculation, information to be extracted varies between the static failure mode and the time-dependent failure mode. Information important for the static failure mode includes the maximum value for loads encountered during the designed life expectancy and the amount of time until a certain magnitude of load is encountered for the first time, and the like. On the other hand, information important for the time-dependent failure mode relates to frequency data indicating the magnitude of loads imposed during the designed life expectancy and the number of times loads are imposed during the designed life expectancy.

The following will be shown below.

(1) The example in which the load calculation is carried out using a cycle count method (which is important for fatigue damage to a solder junction or the like) for a time-series irregularly varying load.

(2) The example in which the maximum load (which is important for static damage such as an element crack) is estimated for the time-series irregularly varying load on the basis of statistics of extremes.

First, description will be given of the load calculation using the cycle count method in (1).

The Miner rule (cumulative damage rule) is used to estimate a fatigue life expectancy for the irregularly varying load. Application of the cumulative damage rule requires that a frequency distribution be determined which relates to the amplitude of the physical quantity corresponding to fault physics, such as temperature width, strain, or stress. For example, for thermal fatigue damage to the solder junction, the frequency distribution of the temperature width may be acquired, which significantly affects the range of strain that may occur at the solder junction.

The cycle count method is roughly classified into (A) methods focusing on peak values (maximum and minimum values) and (B) methods focusing on the range of the peak values (rain flow method, range pair method, hysteresis loop counting method, and the like). The (A) methods cannot distinguish two irregular variations from each other which have the same maximum and minimum values but different average values. Consequently, the (B) methods are considered to be reasonable. The cycle count method enables the calculation of the amplitude in each cycle, the average value in each cycle, the number of cycles, the period of each cycle, and the start time of each cycle, from time series data. For the details of the cycle count method and the rain flow method, see Proc. 1974 Symp. on Mechanical Behavior of Material (T. Endo et al. (1974), pp. 371). For the details of the hysteresis loop counting method, see Collected Papers of the Japan Society for Mechanical Engineers (Ippei USU, Hiroyuki OKAMURA, A, Vol. 44, No. 386, (1978), pp. 3322).

Now, description will be given of a method for estimating the maximum load on the basis of the statistics of extremes in (2) (maximum load distribution estimating method).

The technique for the statistics of extremes can be used to estimate the maximum value of the irregularly varying load. The time axis for the irregularly varying data is separated into pieces each of a certain length "$\Delta T$". The maximum load "x" in each "$\Delta T$" (interval maximum value) is obtained. The distribution function of "x" is defined as "F1(x)". In general, the asymptotic distribution of the maximum value is often used as "F1(x)". Then, the designed life expectancy is defined as "n$\Delta T$", and the distribution function of the maximum load encountered during "n$\Delta T$" is defined as "Fn(x)". Then, "Fn(x)" is determined by:

$$Fn(x)=\{F1(x)\}^n.$$

The distribution of the interval maximum value often conforms to the maximum value asymptotic distribution of the first kind or the maximum value asymptotic distribution of the second kind.

When the skirt of the distribution of "1−F1(x)" can be approximated by an exponential distribution, that is, the distribution of "1−F1(x)" can be approximated by the Gumbel distribution:

$$1-F1(x)=(1-F1(xm))\exp(-(x-xm)/\xi)$$

in the vicinity of the mode "xm" of "fn(x)", $$Fn(x)=\exp(-\exp(-(x-xm)/\xi))$$

is obtained as the asymptotic distribution of the maximum value. In this case, "$\xi$" denotes a parameter for a measure and a position. This distribution is called the Gumbel distribution of the maximum value or the maximum value asymptotic distribution of the first kind.

When the skirt of the distribution of "1−F1(x)" can be approximated by the power function:

$$1-F1(x) \propto (x-x0)^{-\epsilon},$$

$$Fn(x)=\exp(-(x-x0)/\xi)^{-\epsilon})$$

is obtained as the asymptotic distribution of the maximum value. In this case, "$\epsilon$", "$\xi$", and "x0" denote parameters for a shape, a measure, and a position, respectively. This distribution is called the maximum value asymptotic distribution of the second kind.

If the interval maximum value conforms to the Gumbel distribution as in the case of:

$$F1(x)=\exp\{-\exp((\gamma-x)/\beta)\},$$

"x" lies on a straight line on the double exponential probability paper. In this case, "Fn(x)" is obtained by translating the straight line of "F(x)" by "log(n)".

Description has been made of the method for estimating the distribution of the maximum load. To estimate the maximum load as a single numerical value instead of a distribution, the concept of a recursive period is normally used. The recursive period "T(x)" is the average value for the period (expressed using "$\Delta T$" as a unit) after a load exceeding a certain value x appears and before a load exceeding the value x appears again. When the distribution function of the interval maximum value is defined as "F1(x)", the relationship:

$$T(x)=1/(1-F1(x))$$

is established. "T(x)" increases consistently with "x". The estimating method using the recursive period uses, as the estimated value of the maximum load, such "x" as makes "T(x)" equal to the designed life expectancy of the product. That is, when the designed life expectancy is defined as "n$\Delta t$", such "x" as leads to "F1(x)=1−1/n" is the estimated value. The maximum load determined as described above has a magnitude such that the load appears once during the designed life expectancy on average. However, the maximum load encountered during the designed life expectancy conforms to the probability distribution. Consequently, the maximum load greater than the estimated value based on the recursive period may appear at the following probability:

$$P=1-\{F1(x)\}^n=1-(1-1/n)^n.$$

Now, step S5 will be described. In step S5, calculation of a failure occurrence risk or health monitoring is carried out on the basis of the calculated load. The present step is roughly divided into [31] to [33] described below.

[31] The load model acquired in the normal state is used to define the abnormal state and normal state of the target failure mode. The following are preset: the target failure mode, the place on the circuit board at which a failure is to be detected, the load model, and the reliability model (fault physics model).

[32] The load level corresponding to the failure mode is calculated. For example, the load level (fatigue level) in the use state is calculated from a thermal load calculated by the cycle count method. Further, the load level in the use state (rough use: the relative ratio of the load level to a design assumed value) is calculated from the maximum load during a given period (guarantee period of service or five years) calculated on the basis of the maximum load distribution, that is, information is calculated which indicates the rate of the load in a given reference load (the level of harshness).

[33] Whether the load level is normal or abnormal is determined on the basis of the determined load level. Whether the load level is normal or abnormal is determined on the basis of the multiple testing hypothesis, the Mahalanobis distance, or a data table. Here, whether the load level is normal or abnormal may be determined by inputting the load level to the reliability model to calculate a failure occurrence probability or life expectancy and comparing the calculated failure occurrence probability or life expectancy with a corresponding threshold. Further, the history of the load level is expected to be useful for determining the cause of the failure phenomenon when the apparatus is found abnormal.

As described above, the present embodiment prepares the first and second statistical model and determines the physical quantity and load from the monitoring variable via the latent variable. This enables the physical quantity for any place on the circuit board to be accurately determined even from values from a small number of sensors arranged at limited positions (even from a small number of observation data). Thus, the load on the electronics circuit board can be properly calculated on the basis of the determined physical quantity.

Further, even with a small number of observation data, the statistical model can be flexibly identified using the different types of data, that is, the set of observation data and the results of CAE phenomenon analysis.

Furthermore, even if the observation data or the phenomenon analysis results have uncertainty, stable estimation results can be obtained by introducing the statistical model (regression model, occurrence frequency distribution, or probability distribution) and the pre-distribution. This enables the load model to be flexibly updated even with a change in design or operation conditions or in the definition of the normal state.

What is claimed is:

1. A load calculating device comprising:
a variable acquiring unit configured to acquire, as monitoring variables, a detected value by a sensor monitoring a state of a circuit board and a performance characteristic obtained by a tool monitoring performance of the circuit board, wherein one or more electronic components are mounted on the circuit board;
a first storage configured to store a first statistical model that is one of:
a regression model determining an intermediate variable from the monitoring variables,
an occurrence frequency distribution relating to the monitoring variables and the intermediate variable, and
a probability distribution relating to the monitoring variables and the intermediate variable;
a second storage configured to store, for at least one place on the circuit board, a second statistical model that is one of:
a regression model determining a physical quantity from the intermediate variable,
an occurrence frequency distribution relating to the intermediate variable and the physical quantity, and
a probability distribution relating to the intermediate variable and the physical quantity; and
an arithmetic processor configured to calculate the intermediate variable from the monitoring variables acquired by the variable acquiring unit according to the first statistical model and calculate the physical quantity on the at least one place from the calculated intermediate variable according to the second statistical model,
wherein the intermediate variable is a variable which expresses a different physical quantity than the physical quantity calculated according to the second statistical model and is not monitored by the monitor or the tool.

2. The device according to claim 1, wherein the arithmetic processor calculates, from time series data on the physical quantity, at least one of loads including:
an occurrence frequency of the physical quantity,
an occurrence frequency relating to an amplitude of the physical quantity,
an occurrence frequency relating to a gradient of the physical quantity,
an occurrence frequency relating to a variation coefficient for the physical quantity, and
a maximum load distribution based on an extreme statistical model.

3. The device according to claim 2, further comprising a display output unit configured to display data on the physical quantity or data on calculated load, on a screen of a display.

4. The device according to claim 3, wherein the arithmetic processor calculates a ratio of the calculated load to a given reference load, and
the display output unit displays the calculated ratio on the screen.

5. The device according to claim 2, wherein the arithmetic processor calculates a defect occurrence probability of the circuit board from the calculated load according to a given first reliability model.

6. The device according to claim 2, wherein the arithmetic processor calculates a life expectancy of the circuit board from the calculated load according to a given second reliability model.

7. The device according to claim 1, further comprising:
a statistical model identifying unit configured to:
set a pre-distribution expressing an uncertainty of the intermediate variable, a type of the first statistical model, and a type of the second statistical model,
execute an operation test in which the monitoring variables and the physical quantity on the at least one place are monitored to acquire data sets each of containing the monitoring variables and the physical quantity, and
calculate parameters of the first and second statistical models from the data sets and the pre-distribution of the intermediate variable and thereby identify the first statistical model and the second statistical model.

8. The device according to claim 7, wherein the statistical model identifying unit is further configured to:
generate, by a Monte Carlo method, random numbers conforming to the pre-distribution of the intermediate variable, as numerical experiment points,
execute physical phenomenon simulation on each of the numerical experiment points to acquire sampling data on the physical quantity on the at least one place, and
identify the occurrence frequency distribution as the second statistical model on the basis of the numerical experiment points and the sampling data.

9. The device according to claim 7, wherein the statistical model identifying unit executes the operation test while setting performance of the electronic component or a state of a monitoring target of the sensor forcibly.

10. The device according to claim 7, wherein the statistical model identifying unit executes the operation test at a time when an electronic apparatus including the circuit board is activated, at a time of a user standby state in which an application is inactive after the electronic apparatus is activated, or at a time of a steady operation state set forcibly.

11. The device according to claim 1, wherein the arithmetic processor:
sets a third statistical model that is a data distribution model relating to a physical quantity on places including the at least one place and a different one place on the circuit board from the at least one place,
sets a pre-distribution of the physical quantity on the at least one place on the circuit board, and
estimates the physical quantity on the different one place on the basis of the third statistical model and the pre-distribution every time the physical quantity on the at least one place is calculated.

12. The device according to claim 11, further comprising a display output unit configured to display a contour diagram showing the physical quantity calculated for the at least one place and the physical quantity estimated for the different one place, on a screen of a display in time series.

13. The device according to claim 1, further comprising third storage configured to store a fourth statistical model that is one of a regression model determining a monitoring variable from a physical quantity, an occurrence frequency distribution relating to the physical quantity and the monitoring variable, and a probability distribution relating to the physical quantity and the monitoring variable, wherein the arithmetic processor is further configured to:
locate a specific place on the circuit board at which the physical quantity exhibits the smallest variation in response to a variation in the intermediate variable,
calculate the monitoring variable on the basis of a physical quantity on the specific place and the fourth statistical model, and
use the calculated monitoring variable to calculate the intermediate variable.

14. A computer-implemented load calculating method comprising:
acquiring, as monitoring variables, a detected value by a sensor monitoring a state of a circuit board and a performance characteristic obtained by a tool monitoring performance of the circuit board, wherein one or more electronic components are mounted on the circuit board;
reading out from storage a first statistical model that is one of:
  a regression model determining an intermediate variable from the monitoring variables,
  an occurrence frequency distribution relating to the monitoring variables and the intermediate variable, and
  a probability distribution relating to the monitoring variables and the intermediate variable;
calculating the intermediate variable from acquired monitoring variables according to the first statistical model;
reading out from the storage, for at least one place on the circuit board, a second statistical model that is one of:
  a regression model determining a physical quantity from the intermediate variable,
  an occurrence frequency distribution relating to the intermediate variable and the physical quantity, and
  a probability distribution relating to the intermediate variable and the physical quantity; and
calculating the physical quantity on the at least one place from the calculated intermediate variable according to the second statistical model,
wherein the intermediate variable is a variable which expresses a different physical quantity than the physical quantity calculated according to the second statistical model and is not monitored by the monitor or the tool.

* * * * *